United States Patent [19]

Iwakiri et al.

[11] Patent Number: 5,398,209
[45] Date of Patent: Mar. 14, 1995

[54] SERIAL ACCESS MEMORY WITH COLUMN ADDRESS COUNTER AND POINTERS

[75] Inventors: Iturou Iwakiri, Miyazaki; Koji Murakami, Tokyo, both of Japan

[73] Assignee: Oki Electric Industry Co., Ltd., Tokyo, Japan

[21] Appl. No.: 80,482

[22] Filed: Jun. 18, 1993

[51] Int. Cl.[6] .................................. G11C 8/00
[52] U.S. Cl. .................. 365/230.03; 365/221; 365/233; 365/236; 365/240
[58] Field of Search ............. 365/219, 221, 230.03, 365/236, 239, 233, 189.05, 189.12, 240, 230.06

[56] References Cited

U.S. PATENT DOCUMENTS 4,890,262 12/1989 Hashimoto et al. ............. 365/236 X
4,954,994 9/1990 Hashimoto ..................... 365/221 X

OTHER PUBLICATIONS

IEEE Journal Of Solid-State Circuits., vol. 26, No. 4, Apr. 1991, N. Y. US, pp. 502-506, Kuriyama et al. "An 8 NS 4 Mb Serial Access Memory," p. 502, left column, line 26–p. 504, right column, line 19; figures 1-9.
1990 Symposium On VLSI Circuits, Jun. 1990, Honolulu USA, pp. 51-52, Kuriyama et al. "A 4 Mbit CMOS SPRAM With 8 NS Serial Access Time," the whole document.

*Primary Examiner*—Joseph A. Popek
*Attorney, Agent, or Firm*—Edward D. Manzo

[57] ABSTRACT

A serial access memory has multiple memory blocks, each with a row-and-column array of memory cells for storing data. Data access is synchronized with a clock signal. A column address counter counts the clock signal to generate a column address. A block selector decodes upper bits of the column address to generate a series of block select signals, which are distributed to the memory blocks. In each memory block a shift register receives and shifts one block select signal to generate a series of column select signals.

18 Claims, 7 Drawing Sheets

SERIAL ACCESS MEMORY WITH COLUMN ADDRESS COUNTER AND POINTERS

BACKGROUND OF THE INVENTION

This invention relates to a method of selecting successive columns in successive memory blocks in a serial access memory.

An example of a serial access memory is a first-in-first-out (FIFO) memory that stores serial input data in synchronization with a write clock, and provides the same data in the same order as serial output in synchronization with a read clock. Such memories are often used as line memories or frame memories in image-processing apparatus. The memory stores data in a row-and-column array of memory cells. In access to a given row, successive columns in that row are selected by shifting a pulse through a shift register clocked by the read or write clock. The shift register is configured as a ring counter, so that it repeatedly selects all columns in ascending order.

If the memory capacity is large, practical design considerations require the array to be subdivided into blocks, each block having its own shift registers for read and write access. The shift register design must now be modified, because each row extends through a plurality of blocks. The conventional modification connects the output end of each shift register to the input end of the shift register in the next block, so that a plurality of shift registers form a single ring counter. This leads, however, to two problems.

One problem is that, especially when the number of blocks is large, highly contorted wiring schemes are needed to interconnect the shift registers for read access into one ring and the shift registers for write access into another ring. Another problem is that the interconnecting signal lines become so long that their parasitic resistance and capacitance slows down the operation of the memory, setting an undesirably low maximum frequency on the read clock and write clock and limiting the serial access rate.

SUMMARY OF THE INVENTION

It is accordingly an object off the present invention to simplify the design of a serial access memory by eliminating interconnections between shift registers.

Another object is to raise the operating speed of a serial access memory.

In the invented serial access memory, data are stored in row-and-column arrays off memory cells in a plurality of memory blocks, and access is synchronized with a clock signal. A column address counter counts the clock signal to generate a column address. A block selector decodes upper bits of the column address to generate a series of block select signals, which are input to respective memory blocks. In each memory block a shift register receives and shifts one block select signal, thereby generating a series of column select signals that select successive columns in that memory block.

DETAILED DESCRIPTION OF THE INVENTION

The invention will now be described with reference to the attached drawings. These drawings are not to be interpreted as restricting the invention: for example, the drawings will show a serial access memory with only four memory blocks, but the invention can be practiced with memories divided into any number of blocks. The scope of the invention should be determined solely from the appended claims.

Figure 1:
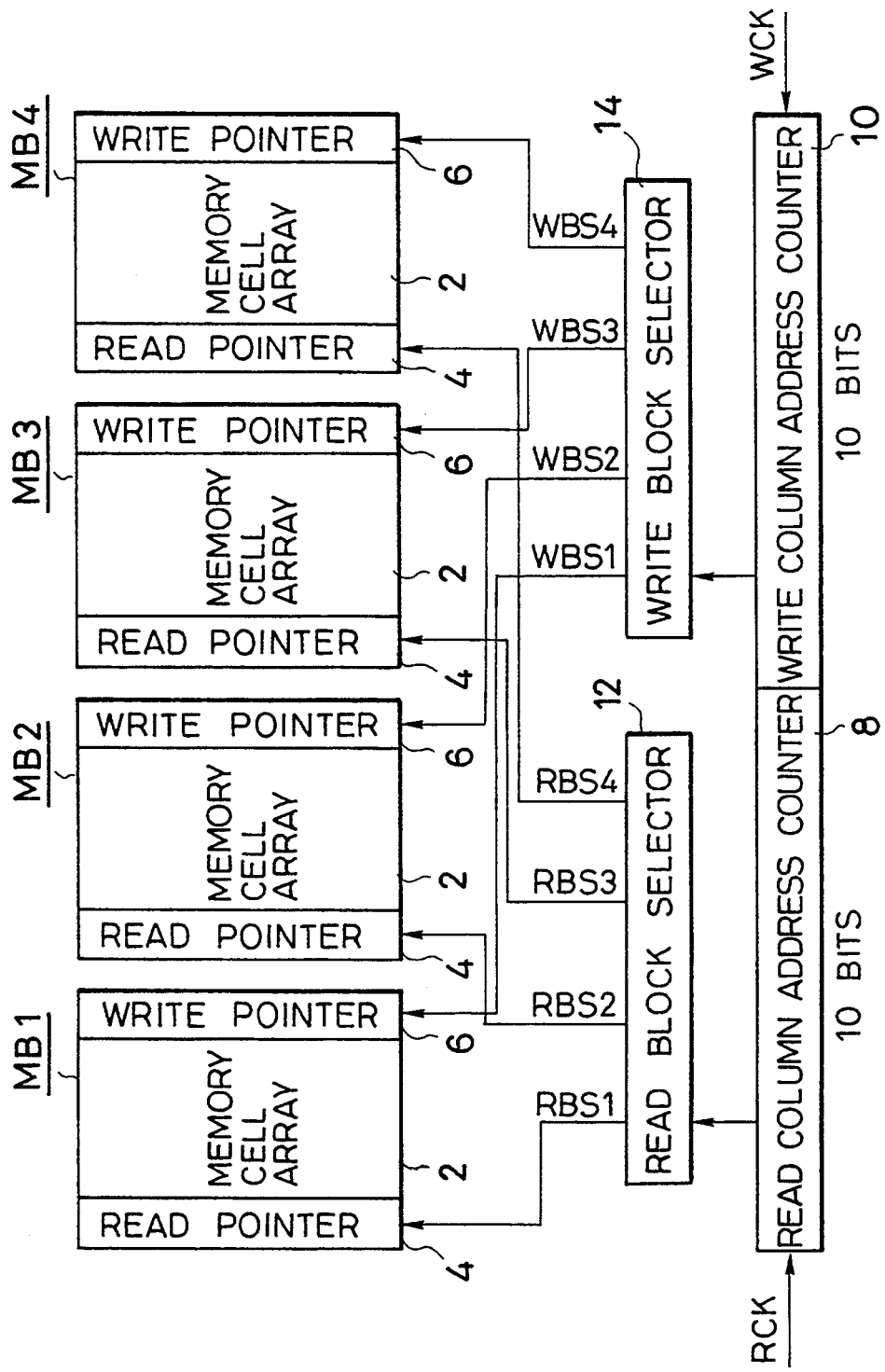
FIG. 1 is a general block diagram illustrating the invented serial access memory.

Referring to FIG. 1, each of the four memory blocks MB1, MB2, MB3, and MB4 comprises a memory cell array 2 and two shift registers 4 and 6. The shift register 4 will be referred to as the read pointer; the shift register 6 will be referred to as the write pointer. Each memory cell array 2 has memory cells arranged in, for example, two hundred fifty-six rows and two hundred fifty-six columns. The read and write pointers 4 and 6 select the columns.

The memory also comprises a read column address counter 8, a write column address counter 10, a read block selector 12, and a write block selector 14. The read and write column address counters 8 and 10 are ten-bit counters. The read column address counter 8 is incremented by a read clock signal RCK; the write column address counter 10 is incremented by a write clock signal WCK. The read block selector 12 receives the two upper bits of the read column address count generated by the read column address counter 8 and decodes these two upper bits to generate four read block select pulses RBS1, RBS2, RBS3, and RBS4, which are supplied to the read pointers 4 in memory blocks MB1, MB2, MB3, and MB4, respectively. The write block selector 14 similarly decodes the two upper bits of the write column address count to generate four write block select pulses WBS1, WBS2, WBS3, and WBS4, which are supplied to the write pointers 6 in memory blocks MB1, MB2, MB3, and MB4, respectively.

Figure 2:
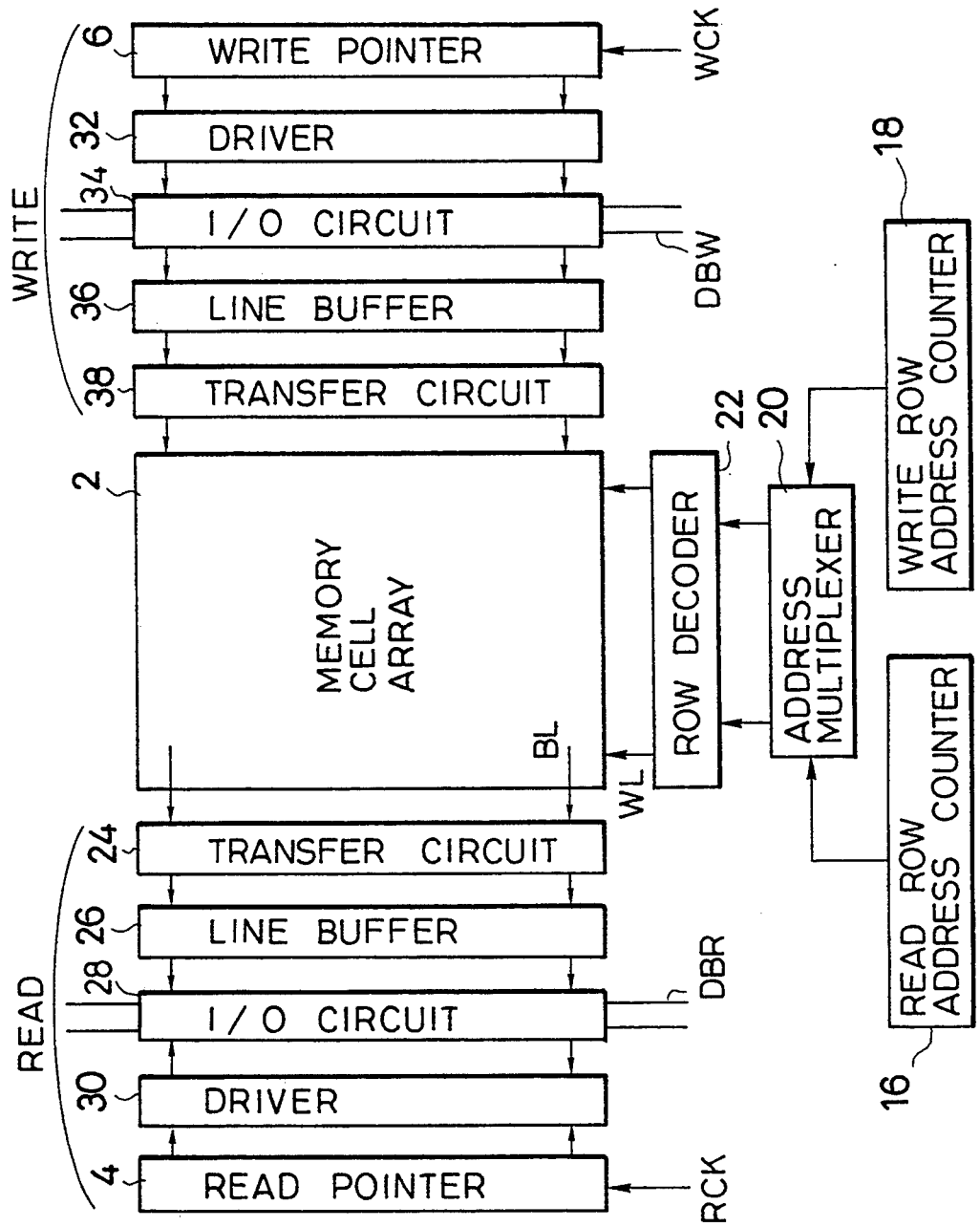
FIG. 2 is a more detailed block diagram illustrating a memory block and its row-selecting circuits.

FIG. 2 shows in more detail the circuits associated with a memory cell array 2 for selecting rows and transferring data. The rows correspond to word lines WL, which cross the memory cell array 2 in the vertical direction in the drawing. Columns correspond to bit lines BL, which cross the memory cell array 2 in the horizontal direction in the drawing. Memory cells are disposed at the intersections of the word lines and bit lines, each memory cell being coupled to one word line and one bit line.

Rows are selected by a read row address counter 16, a write row address counter 18, an address multiplexer 20, and a row decoder 22. The read and write row address counters 16 and 18 are up-counters that generate, for example, eight-bit row addresses. The address multiplexer 20 selects the row address output From either the read row address counter 16 or the write row address counter 18 for provision to the row decoder 22. The row decoder 22 decodes the provided address and drives one of the word lines WL to the active state.

Bits of read data are transferred out of the memory cell array 2 to a read data bus DBR by a transfer circuit 24, a line buffer 26, an input/output (I/O) circuit 28, a driver circuit 80, and the read pointer 4. The transfer circuit 24 comprises switches, such as transistor switches, that all turn on or off simultaneously. The bit lines are coupled through these switches to the line buffer 26, which is a parallel register for storing two hundred fifty-six bits of data. The line buffer 26 is coupled through switches in the I/O circuit 28 to the read data bus DBR. The read pointer 4 selects one column at a time, causing the driver circuit 80 to turn on one switch at a time in the I/O circuit 28, thereby transferring one bit at a time from the line buffer 26 to the read data bus DBR.

Bits of write data are transferred from a write data bus DBW into the memory cell array 2 by the write pointer 6 and a driver circuit 32, an I/O circuit 34, a line buffer 36, and a transfer circuit 38. The write pointer 6 selects one column at a time, causing the driver circuit 32 to turn on one switch at a time in the I/0 circuit 34, thereby transferring one bit at a time from the write data bus DBW into the line buffer 36. From the line buffer 36, the data bits are transferred all at once via the transfer circuit 38 into the memory cell array 2.

Figure 3:
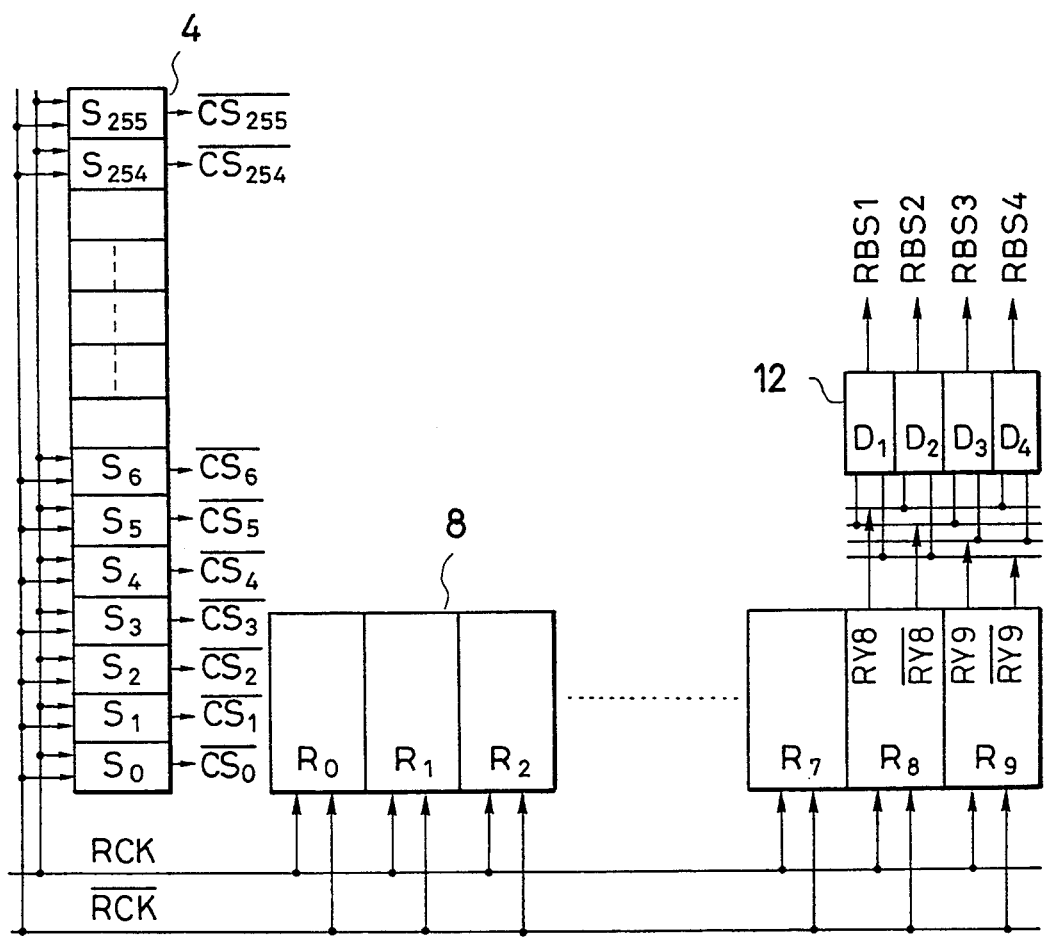
FIG. 3 is a more detailed block diagram illustrating column-selecting circuits.

FIG. 3 is a more detailed block diagram of the read pointer 4, read column address counter 8, and read block selector 12, which select columns for read access. Details of the write pointer 6, write column address counter 10, and write block selector 14 are similar, so a separate drawing will be omitted.

The read clock is a complementary clock comprising two mutually inverse clock signals RCK and $\overline{RCK}$. The read pointer 4 is a shift register comprising two hundred fifty-six stages $S_0$ to $S_{256}$, which are clocked by the read clock signals RCK and $\overline{RCK}$ so as to shift data from $S_0$ toward $S_{255}$. Column select signals $\overline{CS_0}$ to $\overline{CS_{255}}$ are output from the corresponding stages. The column select signals are active low.

The read column address counter 8 comprises, for example, flip-flops $R_0$ to $R_9$ cascaded so as to count cycles of the read clock signal RCK. The count held in the read column address counter 8 is a ten-bit column address. The flip-flops are synchronized by RCK and $\overline{RCK}$ so that transitions in the count occur at, for example, the fall of RCK. The flip-flops $R_8$ and $R_9$ output two pairs of complementary signals denoted RY8, $\overline{RY8}$, RY9, and $\overline{RY9}$, representing the upper two bits of the column address. The read block selector 12 comprises four unit decoders $D_1$, $D_2$, $D_3$, and $D_4$, which decode RY8, $\overline{RY8}$, RY9, and $\overline{RY9}$, to generate the block select pulses RBS1, RBS2, RBS3, and RBS4.

Figure 4:
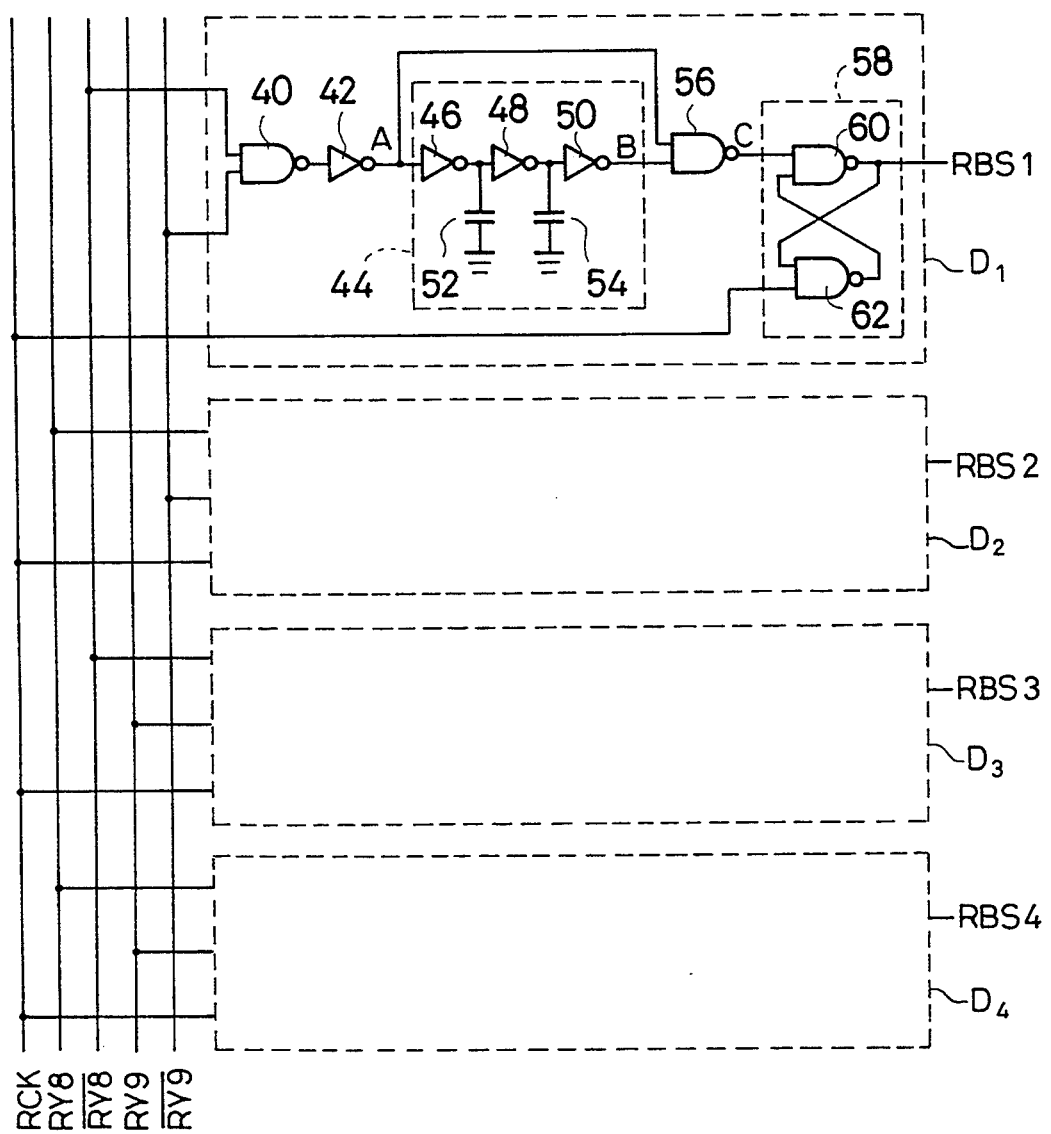
FIG. 4 is a circuit diagram off the block selector in FIG. 3.

FIG. 4 shows the circuit configuration of the unit decoder $D_1$. A two-input NAND gate 40 performs a NOT-AND Logical operation on $\overline{RY8}$ and $\overline{RY9}$ and an inverter 42 inverts the result to generate a first signal A. A delay line 44, comprising three inverters 46, 48, and 50 coupled in series and capacitors 52 and 54 that capacitively couple the outputs of the inverters 46 and 48 to ground, inverts A to generate a second signal B. A two-input NAND gate 56 performs NOT-AND logic on A and B to generate a third signal C. A flip-flop 58 clocked by RCK, comprising cross-coupled NAND gates 60 and 62, outputs the inverse of C as the first block select signal RBS1. More precisely, the flip-flop 58 outputs the inverse of C when either C or RCK is low, and holds its existing output state when C and RCK are both high.

The other unit decoders $D_2$, $D_3$, and $D_4$ have the same circuit configuration but different pairs of input signals, as indicated in the drawing.

Figure 5:
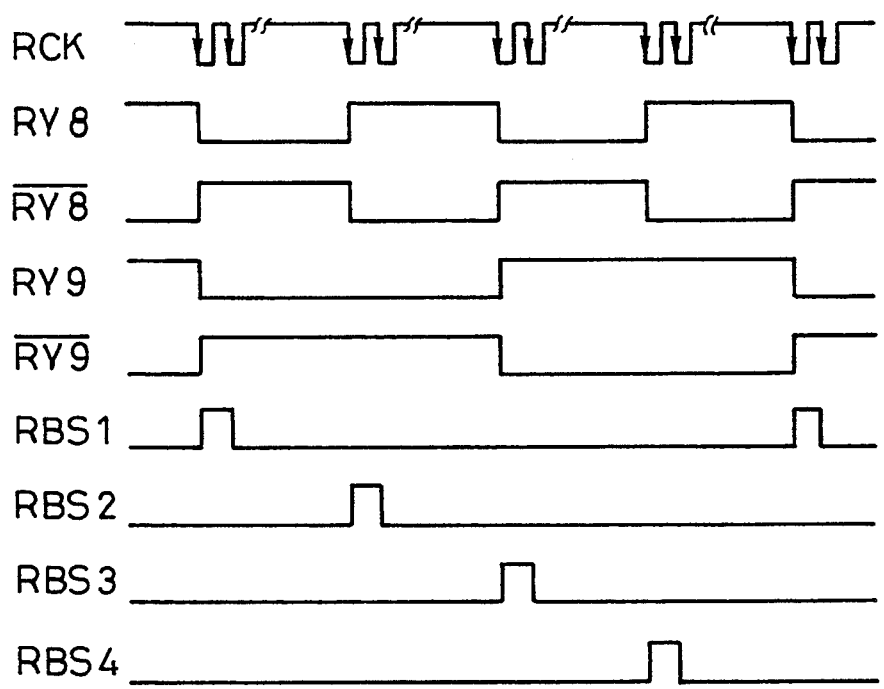
FIG. 5 is a timing diagram illustrating the operation of the column address counter and block selector.

FIG. 5 illustrates the operation of the read column address counter 8 and read block selector 12. Originally RY8 and RY9 are both high and $\overline{RY8}$ and $\overline{RY9}$ are both low, indicating that the upper two bits of the column address are both one's. In FIG. 4, the first signal A is low, the second signal B is high, the third signal C is high, and RBS1 is low.

Eventually the read column address counter 8 increments from a count of all one's to a count of all zero's, causing RY8 and RY9 to go low and $\overline{RY8}$ and $\overline{RY9}$ to go high, the increment occurring at the fall of the read clock RCK. In FIG. 4, the first signal A goes high. Both inputs to the NAND gate 56 are now high, so C goes low and RBS1 goes high. Next RCK goes high, then B goes low and C goes high, but the flip-flop 58 holds RBS1 high until RCK goes low again. In this way the unit decoder $D_1$ produces a block select pulse RBS1 with a pulse width of one cycle of the read clock RCK.

After two hundred fifty-six RCK cycles, only the first two of which are indicated in FIG. 5, RY8 goes high and $\overline{RY8}$ goes low, causing the unit decoder $D_2$ to drive the second block select pulse RBS2 high for one RCK cycle. This is followed by similar output of RBS3 and RBS4 pulses, then another RBS1 pulse. Read block select pulses are thus output in a repeating sequence at intervals of two hundred fifty-six RCK cycles.

Next the operations of reading and writing data will be described.

Referring again to FIG. 2, the read row address counter 16 is adapted to increment at intervals of one thousand twenty-four RCK cycles, and the write row address counter 18 to increment at intervals off one thousand twenty-four WCK cycles. Each time the read row address counter 16 increments, the address multiplexer 20 selects the newly incremented read row address, the row decoder 22 decodes this row address to select a word line WL, and the switches in the transfer circuit 24 are turned on to transfer data from the memory cells connected to that word line into the line buffer 26. Similarly, each time the write row address counter 18 increments, the address multiplexer 20 selects the newly incremented write row address, the row decoder 22 decodes this row address to select a word line WL, and the switches in the transfer circuit, 38 are turned on to transfer data from the line buffer 36 to memory cells connected to this word line in the memory cell array 2.

The read and write row address counters 16 and 18 are coordinated with the read and write column address counters so that data are never transferred into and out of the line buffer 26 or the line buffer 36 at the same time. For example, the read row address counters in memory blocks MB3 and MB4 can be incremented by the fall of RY9, and the read row address counters in memory blocks MB1 and MB2 by the fall of $\overline{RY9}$.

When a first read block select pulse RBS1 is generated at the fall of RY9 in FIG. 5, this pulse is input to the read pointer 4 in memory block MB1 as indicated in FIG. 1. Referring to FIG. 3, this pulse is shifted through the two hundred fifty-six stages $S_0$ to $S_{255}$ of the read pointer 4, causing the column select signals $\overline{CS_0}$ to $\overline{CS_{255}}$ to go low in turn for one read clock cycle each. Referring to FIG. 2, these column select signals $\overline{CS_0}$ to $\overline{CS_{255}}$ are fed through the driver circuit 30 to the I/O circuit 28, causing the data stored in the line buffer 26 to be output on the data bus DBR one bit at a time, in ascending column order, during two hundred fifty-six RCK cycles.

At the end of these two hundred fifty-six RCK cycles a second read block select pulse RBS2 is output as indicated in FIG. 5 and the same process is repeated in memory block MB2, resulting in the output of two hundred fifty-six bits of data from that memory block. Next a third read block select pulse RBS3 is output and the process is repeated in memory block MB3. Then a fourth read block select pulse RBS4 is output and the same process is repeated to output two hundred fifty-six bits of data From memory block MB4, after which another first read block select pulse RBS1 is output and the whole cycle repeats again with data from a different row.

The writing of data is similar, the only difference being that the direction of transfer is reversed. A detailed explanation will accordingly be omitted.

The read block selector 12 and write block selector 14 in FIG. 1 can be coupled to the read and write pointers 4 and 6 in the memory blocks by a simple, orderly wiring system, thereby simplifying the design of the memory as compared with the prior art. There are no interconnecting lines between different pointers, so the cycle speed limitations imposed by the parasitic resistance and capacitance of such interconnecting lines are eliminated. These advantages of the invention become increasingly important as the number of memory blocks increases.

Next, a preferred circuit configuration of the read and write pointers 4 and 6 will be described and its operation explained. All the read and write pointers in all the memory blocks are identically structured, so only the read pointer 4 in the first memory block MB1 will be shown.

Figure 6:
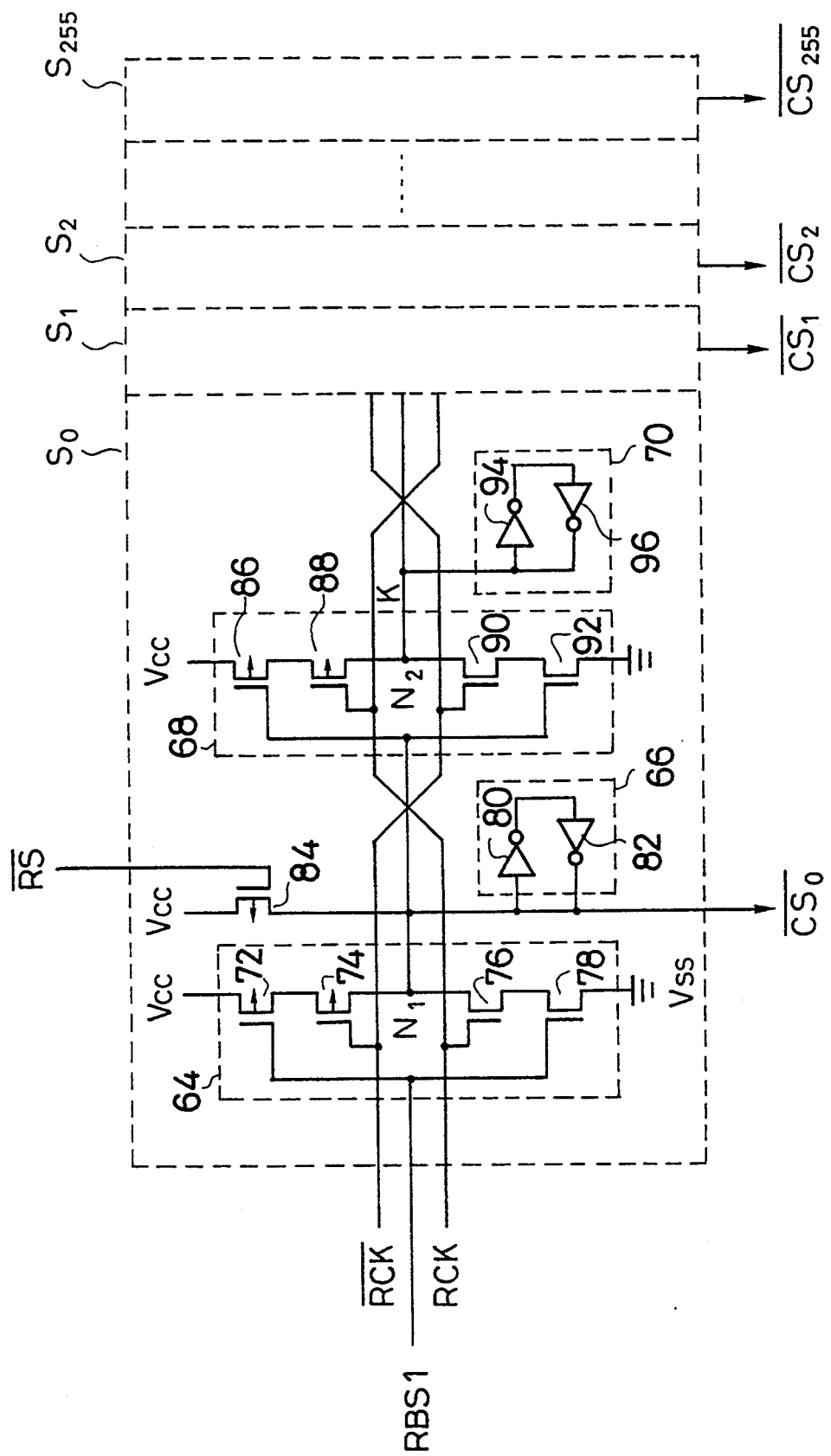
FIG. 6 is a circuit, diagram illustrating a configuration of the shift register in FIG. 3.

Referring to FIG. 6, the first stage $S_0$ of this read pointer comprises a first clocked inverter 64, a first latch 66, a second clocked inverter 68, and a second latch 70.

The first clocked inverter 64 comprises a pair of p-channel metal-oxide-semiconductor field-effect transistors (hereinafter, PMOS transistors) 72 and 74 and a pair of n-channel metal-oxide-semiconductor, or field-effect transistors (NMOS transistors) 76 and 78 coupled in series between a power supply potential Vcc and a ground potential Vss. The PMOS transistor 72 and NMOS transistor 78 are switched on and off by the block select signal RBS1. The PMOS transistor 74 is switched by $\overline{RCK}$, and the NMOS transistor 76 by RCK. The output node $N_1$ of the first inverter 64 is disposed between the two transistors 74 and 76.

The first latch 66 comprises a pair of inverters 80 and 82 coupled in a loop, the output of the inverter 80 being coupled to the input of the inverter 82, and the input of the inverter 80 and output of the inverter 82 both being coupled to the signal line of the column select signal $\overline{CS_0}$. This column select signal line is also coupled to the output node $N_1$ of the first inverter 64, and is coupled through a PMOS reset transistor 84 to Vcc. The reset transistor 84 is switched by a reset signal $\overline{RS}$.

The second inverter 68 is similar to the first, comprising PMOS transistors 86 and 88 and NMOS transistors 90 and 92 coupled in series between Vcc and Vss. However, the PMOS transistor 86 and NMOS transistor 92 are switched by the $\overline{CS_0}$ signal output by the first inverter 64, the PMOS transistor 88 is switched by RCK, and the NMOS transistor 90 is switched by $\overline{RCK}$. The output node $N_2$ of this inverter produces an internal signal K.

The second latch 70 is similar to the first, comprising a looped pair of inverters 94 and 96 coupled to the output node $N_2$ of the second inverter.

The next stage $S_1$ is identical to the initial stage $S_0$ except that instead of receiving the block select signal RBS1, it receives the internal signal K. Succeeding stages are the same, each stage receiving the internal signal output by the preceding stage.

This circuit is initialized by supplying a low reset pulse $\overline{RS}$ to all stages, causing the column select signals $\overline{CS_0}$ to $\overline{CS_{255}}$ all to go to the high (inactive) state, where they remain as long as RBS1 remains low. When RBS1 goes high for one read clock cycle, the circuit operates as follows.

In the first half of this clock cycle, when RCK is low and $\overline{RCK}$ is high, the first inverter 64 is disabled (transistors 74 and 76 are switched off), but the first latch 66 continues to hold $\overline{CS_0}$ at the high level. The second inverter 68 is enabled (transistors 88 and 90 are switched on) so K is low. In the second half of this clock cycle, when RCK is high and $\overline{RCK}$ is low, the first inverter 64 is enabled and the second inverter 68 is disabled. The first inverter 64 inverts RBS1, driving $\overline{CS_0}$ low, while the second latch 70 holds K low.

In the first half of the next clock cycle RBS1 goes low but the first latch 66 continues to hold $\overline{CS_0}$ low, while the second inverter 68 inverts $\overline{CS_0}$ and drives K high. In the second half of this clock cycle the first inverter 64 returns $\overline{CS_0}$ to the high level, the second latch 70 continues to hold K high, and the first inverter in the next stage $S_1$ inverts K to drive $\overline{CS_1}$ low.

Operation continues in this way, the original high RBS1 pulse being passed from inverter to inverter at intervals of one-half clock cycle, with the result that $\overline{CS_0}, \overline{CS_1}, \ldots, \overline{CS_{255}}$ go low in turn for one clock cycle each. At the end of these two hundred fifty-six clock cycles $\overline{CS_0}$ to $\overline{CS_{255}}$ all remain high until the next high RBS1 pulse is received.

Figure 7:
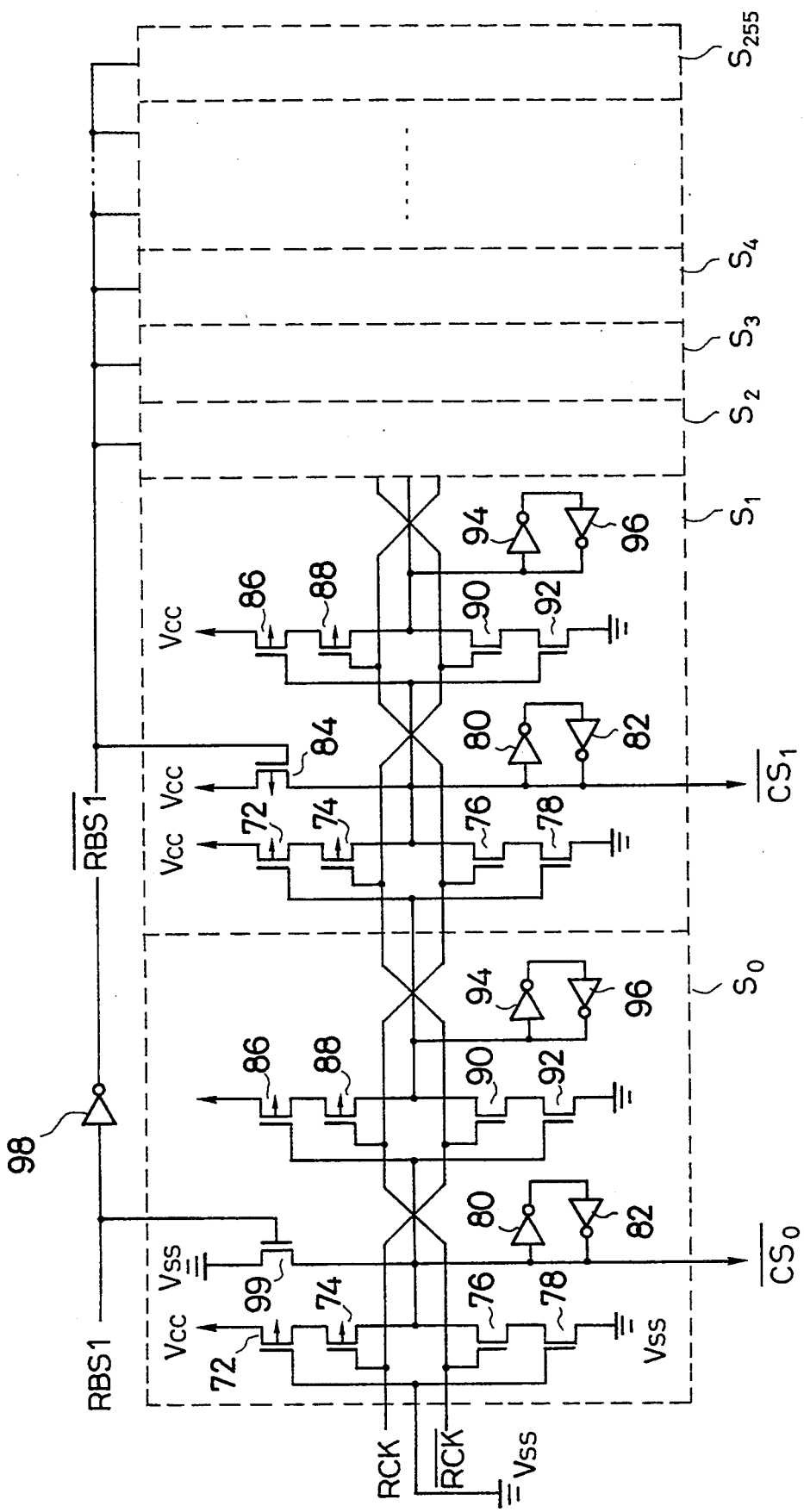
FIG. 7 illustrates a modification of FIG. 6.

FIG. 7 shows a modification of FIG. 6 in which RBS1 is supplied as a set signal to the initial stage $S_0$ and as a reset signal to the other stages $S_1$ to $S_{255}$. Stages $S_1$ to $S_{255}$ are identical to stage $S_0$ in FIG. 6. RBS1 is inverted by an inverter 98 and the inverted signal $\overline{RBS1}$ is supplied to the reset transistor 84 in each of these stages $S_1$ to $S_{255}$. In stage $S_0$, the reset transistor 84 of FIG. 6 is replaced by an NMOS transistor 99, which is switched by RBS1 and couples node $N_1$ to Vss. The input side of stage $S_0$ also coupled to Vss, and the roles of RCK and $\overline{RCK}$ are reversed.

When RBS1 goes high, the NMOS transistor 99 in stage $S_0$ and reset transistors 84 in stages $S_1$ to $S_{255}$ all turn on, setting $\overline{CS_0}$ to the active (low) state and resetting $\overline{CS_1}$ to $\overline{CS_{255}}$ to the inactive (high) state. When RBS1 goes low, the shift register in FIG. 7 operates in the same way as the shift register in FIG. 6, causing $\overline{CS_1}$ to $\overline{CS_{255}}$ to go low in turn for one clock cycle each, while the low input to the initial stage $S_0$ returns $\overline{CS_0}$ to the high level. FIG. 7 has the advantage of not requiring a separate reset signal for initialization.

The invention can of course be practiced with other shift-register circuits, such as circuits employing flip-flops. Moreover, the invention is not restricted to FIFO serial access memories that generate separate read and write column addresses. It is also applicable to dual-port memories having only a single serial port, which require only a single column address counter, and to various other types of multi-port memories.

Many serial access memories already incorporate a column address counter for the purpose of redundant repair, e.g. for selecting redundant bit lines to replace faulty bit lines. In this case the invention can be practiced simply by adding a block selector to generate block select signals, thereby obtaining the advantages of simpler signal-line routing and higher-speed operation with minimal increase in chip size.

Those skilled in the art will notice further modifications that can be made to FIGS. 1 to 7 without departing from the scope of the invention as set forth in the following claims.

What is claimed is:

1. A method of selecting successive columns in successive memory blocks in a serial access memory, each of the successive memory blocks having shift registers which select the columns respectively, the method comprising the steps of:

(a) counting a clock signal to generate column address signals;
    (b) decoding said column address signals to generate a series of block select signals selecting respective memory blocks;
    (c) applying one of said block select signals to one of said memory blocks and shifting said block signal through a corresponding one of said respective shift registers in synchronization with said clock signal, thereby selecting successive columns in said memory block; and
    (d) applying another one of said block select signals to another one of said memory blocks and shifting said another block select signal through another corresponding one of said shift registers in synchronization with said clock signal after step (c), thereby selecting successive columns in said another memory block.

2. The method of claim 1, wherein said step (b) comprises the further steps of:

(e) performing a logic operation on said column address signals to generate a first signal having one state when a certain memory block is selected and another state when that memory block is not selected;
    (f) inverting and delaying said first signal to generate a second signal;
    (g) performing a logic operation on said first signal and said second signal, thereby producing said block select signal; and
    (h) holding said block select signal in response to said clock signal.

3. The method of claim 1, wherein each of said shift registers comprises a plurality of stages, and each stage performs the further steps of:

(i) inverting an input signal in synchronization with said clock signal to generate a column select signal;
    (j) latching said column select signal;
    (k) using said column select signal to select a column in a memory block;
    (l) inverting said column select signal in synchronization with said clock signal to generate an internal signal;
    (m) latching said internal signal; and
    (n) supplying said internal signal as an input signal to a next stage in said shift register.

4. The method of claim 3, wherein said block select signals are supplied as input signals to initial stages of respective shift registers.

5. The method of claim 3, wherein said block select signals are supplied as set signals to initial stages of respective shift registers and as reset signals to all other stages of respective shift registers.

6. A serial access memory for accessing data in synchronization with a clock signal, comprising:

a column address counter for counting said clock signal to generate column address signals;
    a block selector coupled to decode said column address signals and thereby generating a series of block select signals; and
    a plurality of memory blocks having respective memory cell arrays for storing data in rows and columns, and respective shift registers clocked by said clock signal, each of said shift registers being coupled to receive and shift a different one of said block select signals in response to said clock signal and thereby generating a series of column select signals to select successive columns in its memory block.

7. The memory of claim 6, wherein said column address counter, block selector, and shift registers as described in claim 6 are for read access, and further comprising a separate block selector, column address counter, and shift registers as described in claim 6 for write access.

8. The memory of claim 6, wherein said column address counter generates a pair of complementary output signals.

9. The memory of claim 6, wherein said block selector has a plurality of unit selectors, each comprising:

a first logic gate for performing a logic operation on said column address signals to generate a first signal;
    a delay line for delaying and inverting said first signal to generate a second signal;
    a second logic gate for performing a logic operation on said first signal and said second signal to generate said block select signal; and
    a flip-flop, clocked by said clock signal, for holding said block select signal.

10. The memory of claim 6, wherein each of said shift registers has a plurality of stages, each stage comprising:

a first clocked inverter clocked by said clock signal, for receiving and inverting an input signal, thereby generating a column select signal;
    a first latch for latching said column select signal;
    a second clocked inverter, clocked by said clock signal, for receiving and inverting said column select signal, thereby generating an internal signal; and
    a second latch for latching said internal signal and providing same as an input signal to a next stage.

11. The memory of claim 10, wherein said block select signals are supplied as input signals to initial stages of respective shift registers.

12. The memory of claim 10, wherein said block select signals are supplied as set signals to initial stages of respective shift registers and as reset signals to other stages of respective shift registers, thereby setting or resetting the first latch in each stage.

13. A serial access memory having first and second memory blocks, said memory comprising:

a column address counter for counting a clock signal to produce a plurality of column address signals;

a block selector coupled to decode said column address signals and producing a first block select signal and a second block select signal after the first block select signal is produced;

wherein said first memory block has a first memory cell array for storing data in rows and columns and a first pointer substantially arranged on a lateral side of said first memory block, said first pointer receiving and shifting the first block select signal therein in response to the clock signal and selecting successive columns in the first memory cell array in response to the shifted first block select signal; and wherein said second memory block is arranged laterally adjacent to said first memory block on a side opposite of said first pointer, said second memory block having a second memory cell array for storing data in rows and columns and a second pointer substantially arranged on a lateral side of said second memory block being adjacent to said first memory block, said second pointer receiving and shifting the second block select signal therein in response to the clock signal and selecting successive columns in the second memory cell array in response to the shifted second block select signal.

14. The memory of claim 13, wherein said column address counter generates a pair of complementary output signals.

15. The memory of claim 13, wherein said block selector has first and second unit selectors, each comprising:

a first logic gate for performing a logic operation on the column address signals to produce a first signal;

a first delay line for delaying and inverting the first signal to produce a second signal;

a second logic gate for performing a logic operation on the first signal and the second signal to produce a block select signal; and a flip-flop for receiving the clock signal and holding the respective block select signal.

16. The memory of claim 13, wherein each of the first and second pointers has a plurality of stages, each of the stages respectively comprising:

a first clocked inverter coupled for receiving the clock signal and inverting an input signal to produce a column select signal;

a first latch for latching said column select signal;

a second clocked inverter coupled for receiving the clock signal and inverting the column select signal to produce an internal signal; and a second latch for latching the internal signal and providing it as an input signal to a next stage of the respective pointer.

17. The memory of claim 16, wherein the first and second block select signals are supplied as input signals to initial stages of the first and second pointers.

18. The memory of claim 16, wherein the first and second block select signals are supplied as set signals to initial stages of the first and second pointers respectively and as reset signals to other stages of the first and second pointers respectively, thereby setting or resetting the first latch in each stage of the first and second pointers respectively.

* * * * *